United States Patent
Kountanya et al.

(10) Patent No.: US 10,074,589 B2
(45) Date of Patent: Sep. 11, 2018

(54) EMBEDDING DIAMOND AND OTHER CERAMIC MEDIA INTO METAL SUBSTRATES TO FORM THERMAL INTERFACE MATERIALS

(71) Applicant: Hamilton Sundstrand Corporation, Windsor Locks, CT (US)

(72) Inventors: Raja Kountanya, Vernon, CT (US); Michael Paul Humbert, Wethersfield, CT (US); Joseph V. Mantese, Ellington, CT (US); Matthew E. Lynch, Canton, CT (US); Daniel V. Viens, Mansfield Center, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 15/098,597

(22) Filed: Apr. 14, 2016

(65) Prior Publication Data
US 2017/0301605 A1    Oct. 19, 2017

(51) Int. Cl.
  *F28F 13/18*    (2006.01)
  *H01L 23/373*    (2006.01)
  *H01L 21/48*    (2006.01)
  *H01L 23/42*    (2006.01)

(52) U.S. Cl.
  CPC ...... *H01L 23/3735* (2013.01); *H01L 21/4871* (2013.01); *H01L 23/3731* (2013.01); *H01L 23/3732* (2013.01); *H01L 23/3736* (2013.01); *H01L 23/3737* (2013.01); *H01L 23/42* (2013.01)

(58) Field of Classification Search
  CPC ............ H01L 23/3735; H01L 23/3731; H01L 23/3782; H01L 23/3736; H01L 23/3737; H01L 21/4871; H01L 21/02112; H05K 1/0203
  USPC ........................................................ 165/133
  See application file for complete search history.

(56) References Cited

U.S. PATENT DOCUMENTS

| | | |
|---|---|---|
| 4,782,893 A | 11/1988 | Thomas |
| 8,575,051 B2 | 11/2013 | Lüdtke |
| 9,156,058 B2 | 10/2015 | Brandl et al. |
| 2003/0175559 A1* | 9/2003 | Morelli ................. C23C 24/04 428/702 |

(Continued)

FOREIGN PATENT DOCUMENTS

| | | |
|---|---|---|
| JP | 2006270062 A | 10/2006 |
| JP | 2007214492 A | 8/2007 |

(Continued)

OTHER PUBLICATIONS

Extended European Search Report, for European Patent Application No. 17161859.8, dated Sep. 8, 2017, 8 pages.

*Primary Examiner* — Davis Hwu
(74) *Attorney, Agent, or Firm* — Kinney & Lange, P.A.

(57) ABSTRACT

A multi-layer structure includes a substrate with a surface and with particles partially covering and partially embedded in the surface. The particles have high thermal conductivity and low electrical conductivity. A dielectric layer on the surface partially covers the partially embedded particles. A metal layer on the dielectric layer covering the partially covered particles forms a thermal interface material (TIM) for electronic packaging applications.

12 Claims, 6 Drawing Sheets

(56) References Cited

U.S. PATENT DOCUMENTS

| | | | |
|---|---|---|---|
| 2004/0256731 A1* | 12/2004 | Mao | C08L 65/00 |
| | | | 257/773 |
| 2005/0074355 A1 | 4/2005 | Pickard et al. | |
| 2010/0319897 A1 | 12/2010 | Huang | |
| 2011/0024101 A1 | 2/2011 | Han et al. | |
| 2011/0044004 A1 | 2/2011 | Garosshen et al. | |
| 2014/0262191 A1 | 9/2014 | Strader et al. | |
| 2014/0374897 A1* | 12/2014 | Zhao | H01L 21/4882 |
| | | | 257/713 |
| 2015/0040388 A1* | 2/2015 | Jiang | H05K 1/056 |
| | | | 29/832 |

FOREIGN PATENT DOCUMENTS

| | | |
|---|---|---|
| JP | 2012227271 A | 11/2012 |
| JP | 2013131662 A | 7/2013 |

* cited by examiner

EMBEDDING DIAMOND AND OTHER CERAMIC MEDIA INTO METAL SUBSTRATES TO FORM THERMAL INTERFACE MATERIALS

BACKGROUND

The present invention relates generally to thermal management in electronic packages, and particularly to thermal interface materials.

Electrical components such as semiconductors, integrated circuit packages, transistors, etc. typically have predesigned temperature limits, below which the electrical components optimally operate. Ideally, the temperatures approximate ambient surroundings. Operations of the components often generate internal heating due to switching losses. If the heat is not removed, the electrical components may then operate at temperatures significantly higher than their normal or desirable operating temperatures. Such excessive temperatures may adversely affect the operating characteristics of the electrical components and the operation of the associated devices. In the extreme case, thermal runaway results, and the device is significantly damaged or even fails completely.

To avoid or at least reduce the adverse operating characteristics from the heat generation, the heat should be removed, for example by conducting the heat from the operating electrical components to heat sinks. Concurrently, the electrical component often must be electrically isolated from a heat sink and be capable of withstanding breakdown voltages as high as several hundred volts. The heat sinks may then be cooled by conventional convection, radiation or conduction techniques. During conduction, the heat may pass from the operating electrical components to the heat sinks by direct surface contact between the electrical components and heat sinks and/or by contact of the electrical components and heat sink materials through intermediate electrically insulating mediums such as thermal interface materials.

SUMMARY

A multi-layer thermal interface structure includes a substrate with a surface with particles partially covering and partially embedded in the surface wherein the particles have high thermal conductivity and low electrical conductivity. A dielectric layer on the surface fills in the gaps between the partially embedded particles to prevent electrical breakthrough while enabling the effective conduction of heat through the high thermal conductivity particles. A metal layer covers the dielectric layer.

In an embodiment a method of forming a multi-layer thermal interface structure with a high thermal conductivity and low electrical conductivity top layer on a metallic substrate includes partially covering a top surface of the substrate with electrically insulating particles with high thermal conductivity. Partially melting the top surface of the substrate allows the particles to be partially embedded into the molten surface. Allowing the molten surface to solidify to embed the particles in the surface, covering the space around the partially embedded particles with a dielectric material and covering the dielectric material with a metal layer finishes the process.

DETAILED DESCRIPTION

A thermal interface material (TIM) with high dielectric strength suitable for microelectronic applications is disclosed herein.

Figure 1A:
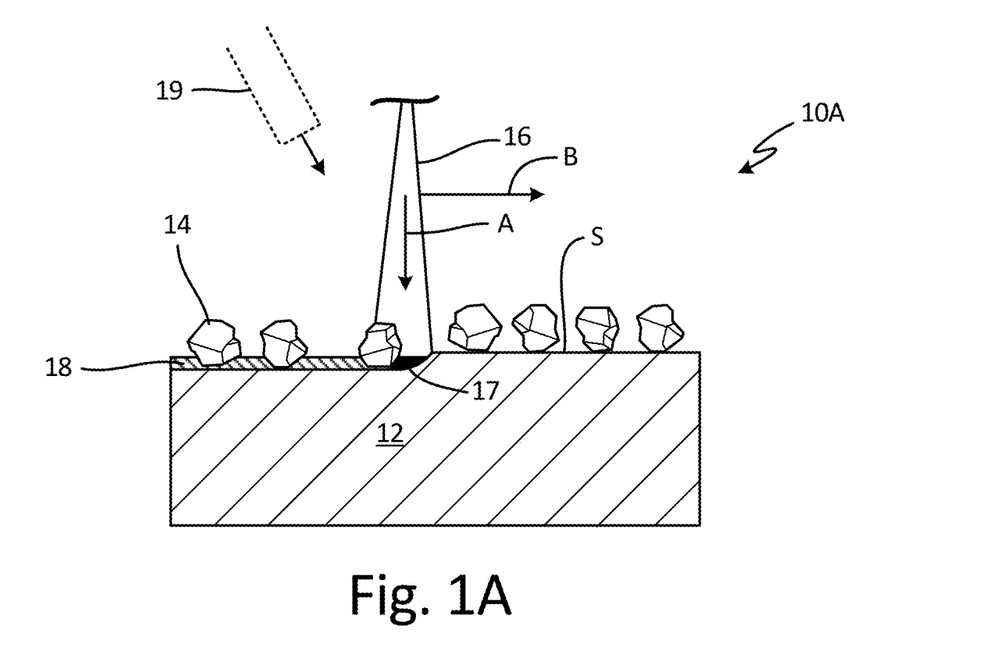
FIG. 1A is a schematic cross-section showing the formation of the first layer of a multi-layer structure according to an embodiment of the invention.
Figure 1B:
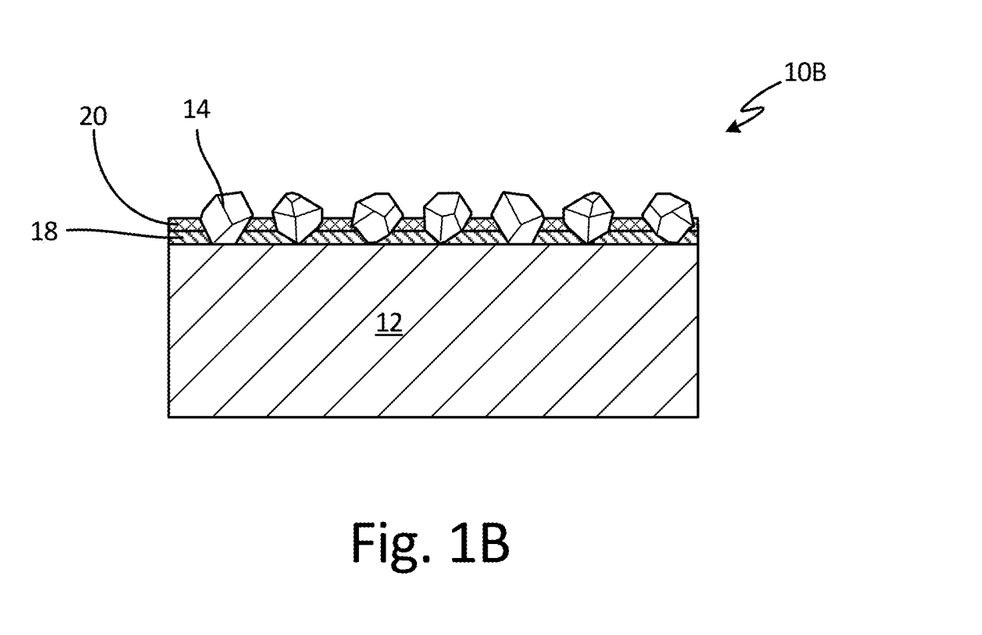
FIG. 1B is a schematic cross-section showing the formation of the first two layers according to an embodiment of the invention multi-layer structure of FIG. 1A.

FIGS. 1A and 1B illustrate an embodiment of such a TIM. High thermal conductivity may be realized with a single layer of isolated particles of high thermal conductivity material embedded in a top surface of a current carrying metal substrate. As shown in FIG. 1A, multi-layer thermal interface material precursor structure 10A may comprise metal substrate 12 and high thermal conductivity electrically insulating particles 14 arranged on a surface S of substrate 12. Particles 14 may be embedded in substrate 12 by locally melting regions on surface S of substrate 12, thereby allowing the particles to be partially immersed in melt pool 17 and to be physically attached to substrate 12 following solidification of melt pool 17 to form layer 18.

FIG. 1A illustrates how surface S may be locally melted by energy beam 16 focused in the direction of arrow A on surface S. As shown, energy beam 16 may move from left to right in a continuous manner in the direction of arrow B to embed high thermal conductivity particles 14 in surface S to form part of a high thermal conductivity layer.

Examples of candidate materials for high thermal conductivity particles 14 may include, but are not limited to, in order of decreasing thermal conductivity, diamond, silicon carbide, hexagonal boron nitride, and silicon nitride. Examples of candidate materials for metal substrate 12 may include, but are not limited to, nickel, titanium, aluminum, copper, cobalt, tungsten and their alloys and mixtures thereof. In the case where particles 14 are diamond, studies have shown that diamond adhesion in solidified nickel and titanium alloy substrates is high, presumably due to the interfacial formation of a metal carbide during interaction with the molten metal.

Methods of partially melting surface S may include, but are not limited to, laser melting, RF induction melting, infrared melting electron arc melting, plasma melting, and others known in the art.

In an additive manufacturing embodiment, multi-layer precursor thermal interface material 10 may be formed by first assembling an array of particles 14 on surface S of substrate 10 by a computer controlled or manually controlled spreading device. Energy beam 16 may then move over surface S by a computer controlled process to locally melt surface S to allow particles 14 to be partially immersed in melt pool 17, and finally embedded in solidified layer 18 in substrate 12. In other embodiments, particles 14 may be delivered to melt pool 17 by feeder apparatus 19 as energy beam 16 traverses surface S of substrate 12 according to a predetermined pattern in the memory of an additive manufacturing system.

The areal coverage of the particles in surface S may be from about 20 to 90 percent. More particularly, the areal coverage may be from 30 to 75 percent.

Examples of additive manufacturing processes may include, but are not limited to, laser engineered net shaping (LENS), direct light manufacturing, selective laser melting (SLM), direct laser melting (DLM), laser based additive manufacturing (LBAM), radio frequency induction melting, and others known in the art.

As shown in FIG. 1B, to continue forming multi-layer thermal interface material (TIM) structure 10B, the space between partially embedded particles 14 may be covered with dielectric polymer 20 to also partially cover particles 14 to provide electrical insulation between substrate 12 and electrical components mounted on the final structure. Dielectric polymer 20 may be a polymer with electrical resistivity greater than $10^6$ ohm-cm. Dielectric polymer 20 may be polyimide, polyethylene, nylon, spin on glass, polyester, flyropolymers such as PTFE and others known in the art.

Figure 1C:
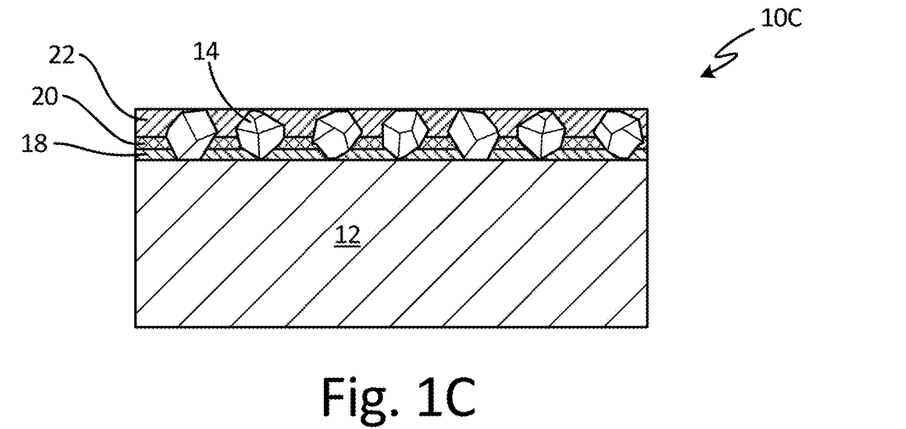
FIG. 1C is a schematic cross-section showing the finished multi-layer structure according to an embodiment of the invention.

As shown in FIG. 1C, final thermal insulating material 10C may be formed by depositing metal layer 22 on polymer electrical insulating layer 20 to insure optimum thermal contact between structures mounted on TIM 10C and thermal conducting particles 14. Metal layers 22 may be copper, aluminum, gold, silver, nickel, titanium and their alloys and mixtures thereof.

Figure 2:
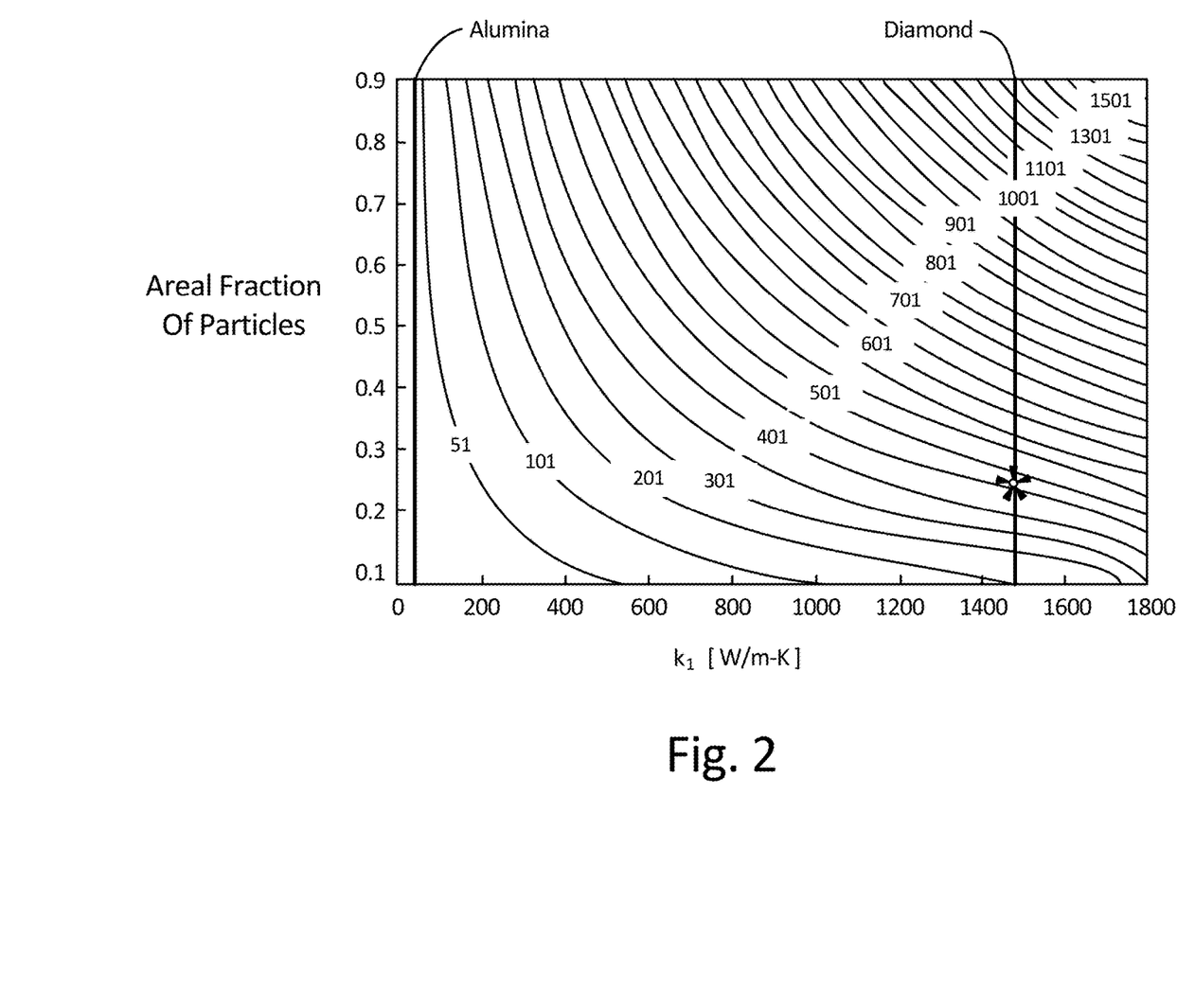
FIG. 2 is a plot showing the thermal conductivity of a surface partially covered with particles as a function of the areal density of the coverage.

Modeling has indicated the particular significance of even a partial coverage of embedded high thermal conductivity particles 14 on surface S of metal substrate 12. FIG. 2 is a plot showing the positive effects on thermal conductivity of even a partial coverage of substrate 12 with high thermal conductivity particles 14. The thermal conductivity perpendicular to the surface layer as a function of the areal fraction of particles on the surface has been modeled. The results are shown in FIG. 2, where the thermal conductivity of a layer of particles on a surface perpendicular to the surface is plotted against the areal fraction of particles on the surface. The lines on the plot are loci of equal values of thermal conductivity (K). Alumina has a value of K that is considered to be 20 W/m-° K, while diamond has a value of K that is considered to be 1500 W/m-° K. The "star" on the diamond vertical line at a 30% areal fraction of diamond indicates a thermal conductivity of about 400 W/m-° K which is 20 times higher than the thermal conductivity of alumina, a common thermal interface material (TIM) in microelectronic packages.

Figure 3A:
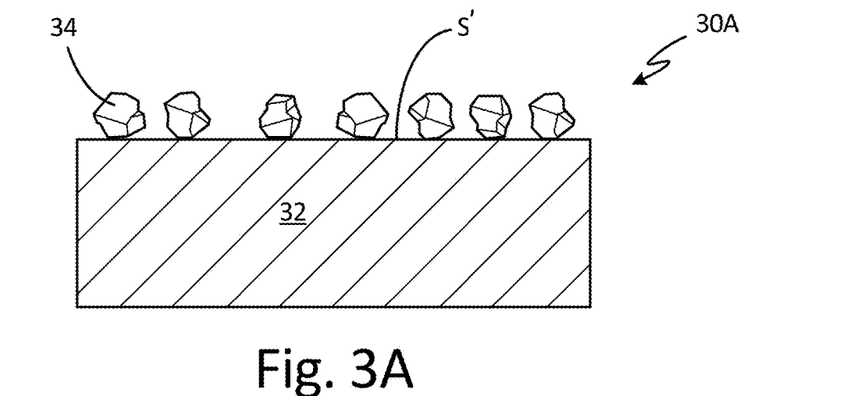
FIG. 3A is a schematic cross-section showing a precursor to a multi-layer structure according to an embodiment of the invention.
Figure 3B:
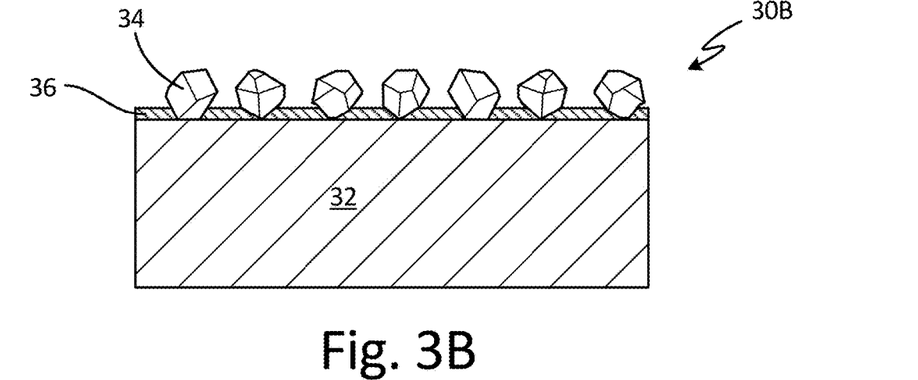
FIG. 3B is a schematic cross-section showing the first layer of a multi-layer structure according to an embodiment of the invention.
Figure 3C:
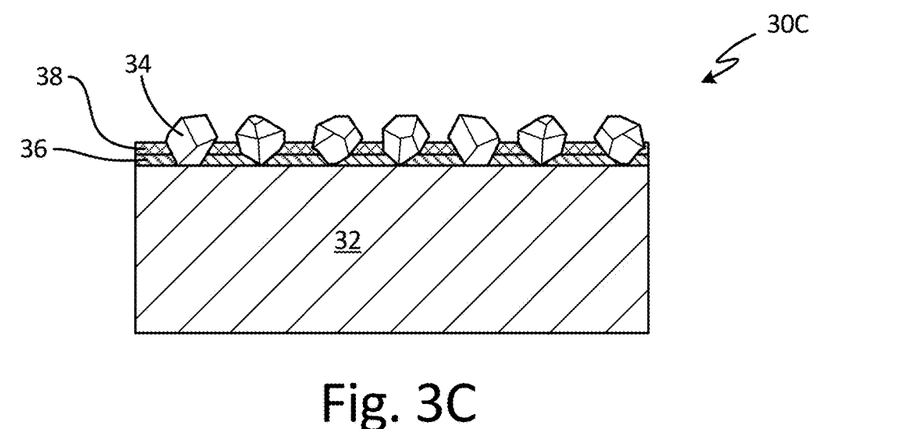
FIG. 3C is a schematic cross-section showing the first two layers of a multi-layer structure according to an embodiment of the invention.
Figure 3D:
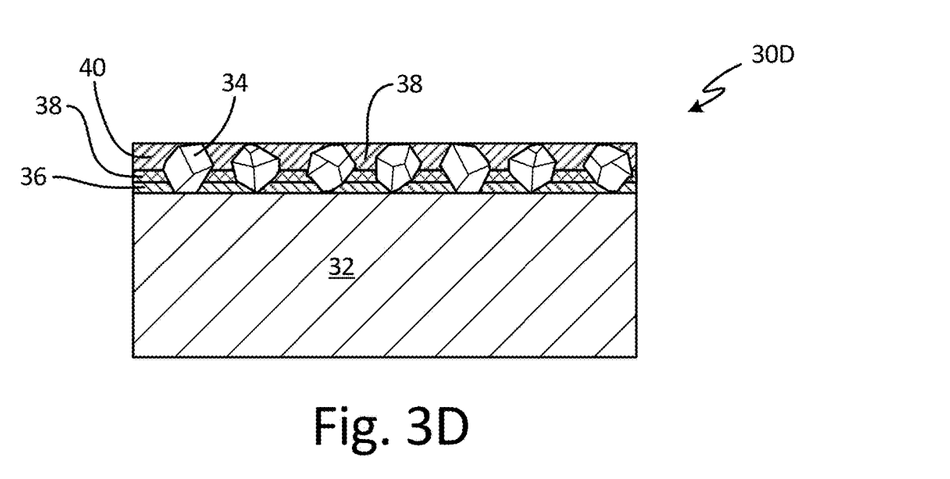
FIG. 3D is a schematic cross-section showing the finished multi-layer structure according to an embodiment of the invention.

FIGS. 3A-3D are diagrams illustrating an alternative method to embed high thermal conductivity particles in a metal substrate. In FIG. 3A, high thermal conductivity particles 34 are shown distributed on surface S' of metal substrate 32 to form TIM precursor 30A. Particles 34 may be distributed on surface S' by means well known in the art and in particular by additive manufacturing technologies. An example may be a programmable nozzle to create uniform coverage of particles on surface S'. Surface S' of substrate 32 may be melted by using any form of directed energy known in the art. For example, surface S' may be subjected to radio frequency (RF) induction that melts surface S' and allows particles 34 to be partially submerged in the melt. Following solidification, the particles may be embedded in solidified layer 36 to form precursor thermal interface material 30B as shown in FIG. 3B. In the next step, electrically insulating polymer layer 38 may be deposited on layer 36 to cover the space between particles 34 and to partially cover particles 34 as shown in FIG. 3C. In the final step, thermally insulating material 30D may be formed by depositing metal layer 40 on polymer layer 38 to cover particles 34 to ensure optimum thermal contact between structures mounted on thermal insulating material 30D and thermal conducting particles 14, as shown in FIG. 3D.

Particles 20 and 34 may have a diameter of from about 1 micron to 100 microns.

Figure 4:
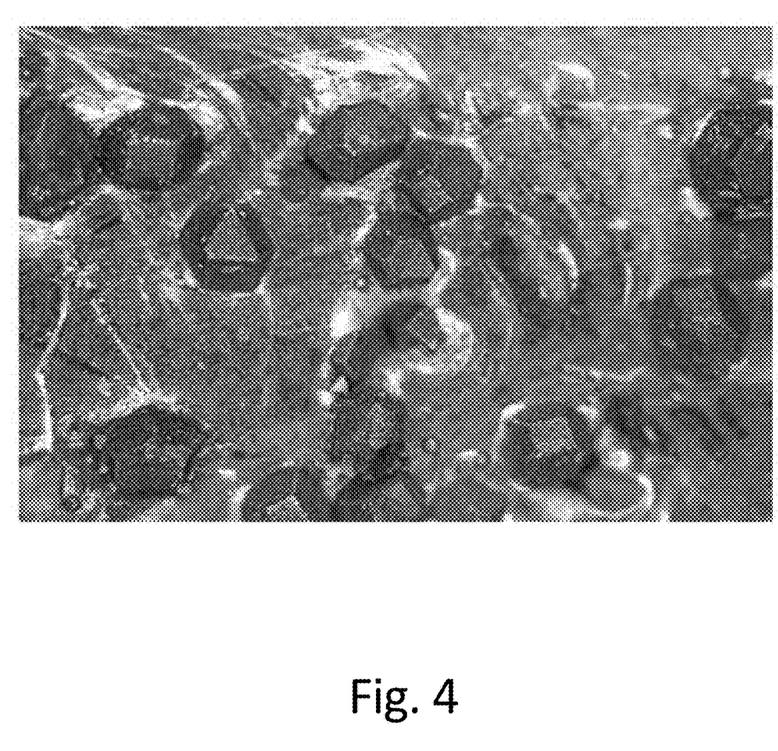
FIG. 4 is a scanning electron micrograph of diamond particles embedded in nickel.

It has been demonstrated that diamond particles can be partially embedded in the surface of metal substrates by irradiating the surface with a laser. FIG. 4 shows a scanning electron micrograph of the surface of a nickel substrate containing diamond particles that were spread on the surface by hand and irradiated with an approximately 1 KW, 1 micron Nd:YAG laser beam. The particles are clearly embedded in the surface in accord with the claims of the present invention. The diamond particles in FIG. 4 are approximately 50 microns in diameter.

Discussion of Possible Embodiments

The following are non-exclusive descriptions of possible embodiments of the present invention.

A multi-layer thermal interface structure includes metal substrate and a layer of particles partially covering and partially embedded in a top surface layer of the substrate wherein the particles have a high thermal conductivity and low electrical conductivity. A dielectric layer on the top surface layer of the substrate covers the surface between the particles and partially covers the partially embedded particles. A metal layer on the dielectric layer covers the partially embedded particles.

The structure of the preceding paragraph can optionally include, additionally and/or alternatively any, one or more of the following features, configurations and/or additional components:

The metal substrate may be nickel, titanium, aluminum, copper, cobalt, tungsten, or alloys thereof or mixtures thereof.

The metal may be a nickel alloy.

The metal may be a titanium alloy.

The particles may be diamond, boron nitride, silicon nitride, or silicon carbide.

The dielectric layer may be a polymer with electrical resistivity greater than $10^6$ ohm-cm.

The polymer may be a polyimide, polyethylene, nylon, spin on glass, and polyester.

The particles may have a diameter of from 1 micron to 100 microns.

A method of forming a multi-layer thermal interface structure with high thermal conductivity and low electrical conductivity on a metal substrate may include partially covering a top surface of the substrate with high thermal conductivity, low electrical conductivity particles. Partially melting the top surface of the substrate may cause the particles to sink into the molten layer. Allowing the molten layer to solidify will embed the particles in the substrate. Partially covering the space around the partially embedded particles and partially covering the partially embedded particles with a dielectric material and covering the partially covered particles with a metal layer completes the process.

The method of the preceding paragraph can optionally include, additional and/or alternatively any, one or more of the following features, configurations, and/or additional components:

The high thermal conductivity, low electrical conductivity particles may be diamond, boron nitride, silicon nitride or silicon carbide.

The high thermal conductivity, low electrical conductivity particles may have a diameter from 1 micron to 100 microns.

The surface coverage of the high thermal conductivity, low electrical conductivity particles on the substrate may be from about 20% to about 90%.

The surface coverage of the high thermal conductivity, low electrical conductivity particles on the substrate may be from about 30% to about 75%.

The metal substrate may be titanium, aluminum, copper, cobalt, tungsten, or alloys thereof or mixtures thereof.

The metal may be a nickel alloy.

Partially melting the top surface of the substrate may include laser melting, RF induction melting, infrared melting, electric arc melting, and plasma melting.

The dielectric material may be a polyimide, polyethylene, nylon, spin on glass, and polyester.

The dielectric material may be a polymer with electrical resistivity greater than $10^6$ ohm-cm.

Partially covering a top surface of the substrate with high thermal conductivity, low electrical conductivity particles and partially melting the top surface of the substrate may comprise and additive manufacturing process.

The additive manufacturing process may be laser engineered net shaping (LANS), direct light manufacturing, selective laser melting (SLM), direct laser melting (DLM), laser based additive manufacturing (LBAM), and radio frequency induction melting.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of forming a multi-layer thermal interface structure with a high thermal conductivity and low electrical conductivity on a metal substrate comprising:

partially covering a top surface of the metal substrate with high thermal conductivity, low electrical conductivity particles;

partially melting the top surface of the metal substrate, thereby causing the particles to sink into the molten metal layer;

allowing the molten metal layer to solidify to partially embed the particles in the solidified metal layer;

partially covering the space around the partially embedded particles and partially covering the partially embedded particles with a polymeric dielectric material; and covering the partially covered particles and the polymeric dielectric material with a metal top layer.

2. The method of claim 1, wherein the high thermal conductivity, low electrical conductivity particles are composed of diamond, boron nitride, silicon nitride or silicon carbide.

3. The method of claim 1, wherein the high thermal conductivity, low electrical conductivity particles have a diameter of from 1 micron to 100 microns.

4. The method of claim 1, wherein the surface coverage of the high thermal conductivity, low electrical conductivity particles on the substrate is from about 20% to about 90%.

5. The method of claim 4, wherein the surface coverage of the high thermal conductivity, low electrical conductivity particles on the substrate is from about 30% to about 75%.

6. The method of claim 1, wherein the metal substrate comprises nickel, titanium, aluminum, copper, cobalt, tungsten, or alloys thereof, or mixtures thereof.

7. The method of claim 6, wherein the metal substrate is a nickel alloy.

8. The method of claim 1, wherein partially melting the top surface of the substrate comprises laser melting, RF induction melting, infrared melting, electric arc melting or plasma melting.

9. The method of claim 1, wherein the polymeric dielectric material is a polyimide, polyethylene, nylon, spin on glass, or polyester.

10. The method of claim 1, wherein the polymeric dielectric material is a polymer with electrical resistivity greater than $10^6$ ohm-cm.

11. The method of claim 1, wherein partially covering a top surface of the substrate with high thermal conductivity, low electrical conductivity particles and partially melting the top surface of the substrate comprises an additive manufacturing process.

12. The method of claim 11, wherein the additive manufacturing process comprises laser engineered net shaping (LENS), direct light manufacturing, selective laser melting (SLM), direct laser melting (DLM), laser based additive manufacturing (LBAM), or radio frequency induction melting.

* * * * *